(12) United States Patent
Chen et al.

(10) Patent No.: US 10,495,096 B2
(45) Date of Patent: Dec. 3, 2019

(54) HEAT DISSIPATION SYSTEM AND FAN DRIVING CIRCUIT

(71) Applicant: ANPEC ELECTRONICS CORPORATION, Hsinchu (TW)

(72) Inventors: Kun-Min Chen, Hsinchu (TW); Ching-Feng Lai, Taipei (TW); Chien-Sheng Wang, Taichung (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 331 days.

(21) Appl. No.: 15/480,065

(22) Filed: Apr. 5, 2017

(65) Prior Publication Data

US 2018/0195515 A1   Jul. 12, 2018

(30) Foreign Application Priority Data

Jan. 6, 2017 (TW) .............................. 106100456 A (51) Int. Cl.
| | | |
|---|---|---|
| *F04D 25/06* | (2006.01) | |
| *H05K 7/20* | (2006.01) | |
| *F04D 27/00* | (2006.01) | |
| *F04D 25/16* | (2006.01) | |

(52) U.S. Cl.
CPC ....... *F04D 25/0693* (2013.01); *F04D 25/166* (2013.01); *F04D 27/004* (2013.01); *H05K 7/20209* (2013.01); *H05K 7/20836* (2013.01)

(58) Field of Classification Search
CPC ........ F04D 25/0693; F04D 25/06; H02P 1/00; H02P 3/00; H05K 7/20209; H05K 7/207; H05K 7/20836
See application file for complete search history.

(56) References Cited

U.S. PATENT DOCUMENTS

| | | | |
|---|---|---|---|
| 6,247,898 B1* | 6/2001 | Henderson | G06F 11/3058 165/80.3 |
| 6,428,282 B1* | 8/2002 | Langley | F04D 27/004 417/2 |
| 9,907,205 B1* | 2/2018 | Chen | H05K 7/20209 |
| 10,018,202 B1* | 7/2018 | Lai | F04D 25/166 |
| 2010/0109591 A1* | 5/2010 | Yeh | G06F 1/20 318/445 |
| 2012/0301321 A1* | 11/2012 | Wu | G06F 1/206 417/1 |
| 2013/0235523 A1* | 9/2013 | Wu | G06F 1/20 361/695 |

* cited by examiner

*Primary Examiner* — Bryan M Lettman
(74) *Attorney, Agent, or Firm* — Li & Cai Intellectual Property (USA) Office (57) ABSTRACT

A heat dissipation system includes a control module, a first fan module and a second fan module. The first fan module is electrically connected to the control module to provide a speed signal to the control module. The second fan module is electrically connected to the control module and the first fan module. The control module provides at least one control signal to control the rotation of the first fan module and the second fan module respectively. The first fan module transmits a first trigger signal to the second fan module, and the second fan module starts to rotate or stops rotating together with the first fan module according to the first trigger signal.

14 Claims, 7 Drawing Sheets

HEAT DISSIPATION SYSTEM AND FAN DRIVING CIRCUIT

BACKGROUND OF THE INVENTION

1. Field of the Invention

The present disclosure relates to a heat dissipation system; in particular, to a heat dissipation system that has high stability.

2. Description of Related Art

In recent years, heat dissipation systems have been widely used in many kinds of electronics devices. Usually, many fan modules are configured in one heat dissipation system. Control circuits of the fan modules may have certain differences that are generated during the manufacturing process. Thus, when these control circuits control the fan modules, it is necessary to make adjustments so that all fan modules can start or stop working simultaneously.

Figure 1:
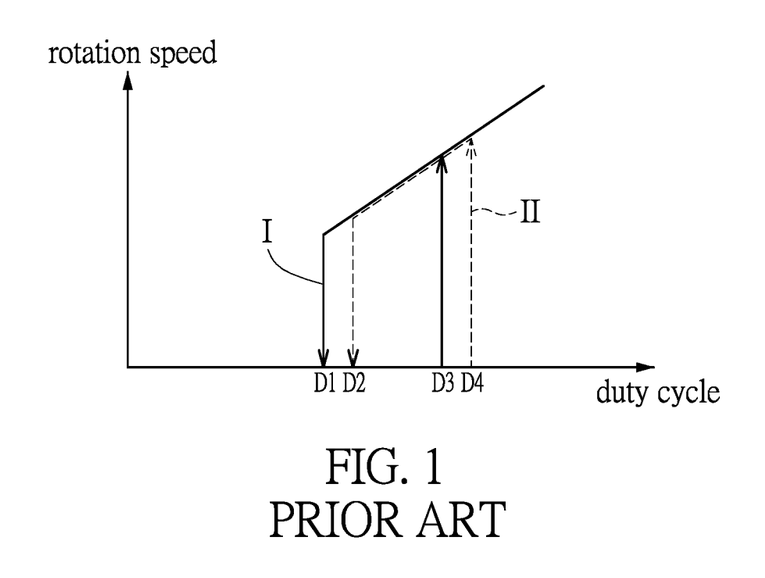
FIG. 1 shows a curve diagram illustrating the rotation speed of a conventional heat dissipation system.

Referring to FIG. 1, a curve diagram illustrating the rotation speed of a conventional heat dissipation system is shown. As shown in FIG. 1, a speed curve I and a speed curve II show the rotation speed of different fan modules. According to the speed curve I, the minimum duty cycle of a control signal is set as the first duty cycle D1 and the maximum duty cycle of a control signal is set as the third duty cycle D3. According to the speed curve II, the minimum duty cycle of a control signal is set as the second duty cycle D2 and the maximum duty cycle of a control signal is set as the fourth duty cycle D4. As mentioned above, control circuits of the fan modules may have certain differences that are generated during the manufacturing process, and thus there are differences between the speed curve I and the speed curve II. Thus, even if the control module can provide the same control signal to different fan modules to stop rotating, the driving circuits of these fan modules may not all work in the same way to achieve the same result. For example, it is possible that one fan module stops rotating while the other fan modules continue to rotate. It is also possible that one fan module has lost the ability to rotate, while the other fan modules continue to rotate normally. In these cases, the control module cannot tell that the heat dissipation system is working abnormally. As a result, the heat dissipation system cannot dissipate heat effectively from the electronic device, and may even result in a breakdown of the heat dissipation system.

In order to solve the above problem, it is necessary to have a heat dissipation system that has high stability and can make all fan modules start or stop rotating simultaneously.

SUMMARY OF THE INVENTION

The present disclosure provides a heat dissipation system. The heat dissipation system receives a control signal from a control module. A first pin of the control module receives a first reference voltage, and a second pin of the control module receives a second reference voltage. The heat dissipation system includes a first fan module and a second fan module. The first fan module has a first pin, a second pin, a third pin, a fourth pin and a fifth pin. The first pin of the first fan module receives a third reference voltage, and the second pin of the first fan module receives a fourth reference voltage. The third pin of the first fan module is electrically connected to a third pin of the control module, and the fourth pin of the first fan module is electrically connected to a fourth pin of the control module. The second fan module has a first pin, a second pin, a third pin, a fourth pin and a fifth pin. The first pin of the second fan module receives the third reference voltage, and the second pin of the second fan module receives the fourth reference voltage. The third pin of the second fan module is electrically connected to the third pin of the control module, and the fifth pin of the second fan module is electrically connected to the fifth pin of the first fan module. A control signal is provided from the third pin of the control module to the first fan module and the second fan module. A speed signal is provided from the third pin of the first fan module to the control module. A first trigger signal is transmitted from the fifth pin of the first fan module to the second fan module, and according to the first trigger signal, the second fan module starts to rotate or stops rotating together with the first fan module.

In one embodiment of the heat dissipation system provided by the present disclosure, a second trigger signal is transmitted from the fifth pin of the second fan module to the first fan module, and the first fan module starts to rotate or stops rotating together with the second fan module according to the second trigger signal.

In one embodiment of the heat dissipation system provided by the present disclosure, when the first fan module stops rotating or starts to rotate, the first trigger signal is provided from the fifth pin of the first fan module to the second fan module, such that the second fan module stops rotating or starts to rotate together with the first fan module.

In one embodiment of the heat dissipation system provided by the present disclosure, the heat dissipation system further includes a third fan module. The third fan module has a first pin, a second pin, a third pin, a fourth pin and a fifth pin. The first pin of the third fan module receives the third reference voltage, and the second pin of the third fan module receives the fourth reference voltage. The third pin of the third fan module is electrically connected to the third pin of the control module, and the fifth pin of the third fan module is electrically connected to the fifth pin of the first fan module and the fifth pin of the second fan module. The control signal is provided from the third pin of the control module to the third fan module. The first trigger signal is transmitted from the fifth pin of the first fan module to the second fan module and to the third fan module. The second fan module and the third fan module start to rotate or stop rotating together with the first fan module according to the first trigger signal. A third trigger signal is transmitted from the fifth pin of the third fan module to the first fan module and to the second fan module, such that the first fan module and the second fan module start to rotate or stop rotating together with the third fan module.

In one embodiment of the heat dissipation system provided by the present disclosure, the first reference voltage and the third reference voltage are a direct voltage larger than 0V, and the second reference voltage and the fourth reference voltage are a grounding voltage.

In one embodiment of the heat dissipation system provided by the present disclosure, the first fan module includes a first fan and a first driving circuit. The first driving circuit provides a driving signal to drive the first fan, and the first driving circuit includes a processing unit, a signal conversion unit, a driving unit and a synchronous control unit. The signal conversion unit receives and converts a control signal to a processing signal, and the control signal is a pulse width modulation signal. The driving unit is electrically connected to the processing unit, and provides the driving signal to drive the first fan according to at least one control signal from the processing unit. The driving signal corresponds to the control signal. The synchronous control unit is electrically connected to the processing unit, and provides a first synchronization signal to the processing unit according to a first adjustment signal from the signal conversion unit. The first trigger signal is provided from the fifth pin of the synchronous control unit to the second fan module, such that the second fan module starts to rotate or stops rotating with the first fan module according to the first trigger signal.

In one embodiment of the heat dissipation system provided by the present disclosure, the first driving circuit further includes a Hall sensor, a speed signal providing unit and a lock unit. The Hall sensor provides a Hall detection signal. The speed signal providing unit provides a speed signal according to the Hall detection signal. The lock unit provides a lock signal to the processing unit when the Hall detection signal indicates an abnormality.

In one embodiment of the heat dissipation system provided by the present disclosure, the processing unit adjusts the first fan according to the lock signal and the first adjustment signal.

The present disclosure also provides a driving circuit that is used in a heat dissipation system. The heat dissipation system includes a fan, and the driving circuit is configured to drive the fan. The driving circuit includes a processing unit, a signal conversion unit, a driving unit and a synchronous control unit. The signal conversion unit is electrically connected to the processing unit, and receives a control signal and converts the control signal to a processing signal. The driving unit is electrically connected to the processing unit, and drives the first fan according to at least one control signal from the processing unit. The synchronous control unit is electrically connected to the processing unit, and provides a first synchronization signal to the processing unit according to a first adjustment signal from the signal conversion unit. The synchronous control unit provides a trigger signal to a synchronous control unit of another driving circuit so that the two driving circuits can work together.

In one embodiment of the driving circuit provided by the present disclosure, the driving circuit further includes a Hall sensor, a speed signal providing unit and a lock unit. The Hall sensor provides a Hall detection signal. The speed signal providing unit provides a speed signal according to the Hall detection signal. The lock unit provides a lock signal to the processing unit when the Hall detection signal indicates an abnormality.

In one embodiment of the driving circuit provided by the present disclosure, the processing unit adjusts the fan according to the lock signal and the first adjustment signal.

To sum up, in the heat dissipation system provided by the present disclosure, a trigger signal can be transmitted and received through the fifth pin of each fan module, such that all fan modules can start to rotate or stop rotating simultaneously. In the present disclosure, not every fan module is controlled by a feedback loop structure. However, by using a simpler structure, a plurality of fan modules in the heat dissipation system provided by the present disclosure can start to rotate or stop rotating simultaneously. Thus, the financial cost and the time consumption in the design of the heat dissipation system can be decreased, and the yield rate of the heat dissipation system can be increased. In addition, the stability of the heat dissipation system can be effectively improved.

For further understanding of the present disclosure, reference is made to the following detailed description illustrating the embodiments of the present disclosure. The description is only for illustrating the present disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION OF EXEMPLARY EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

Figure 2:
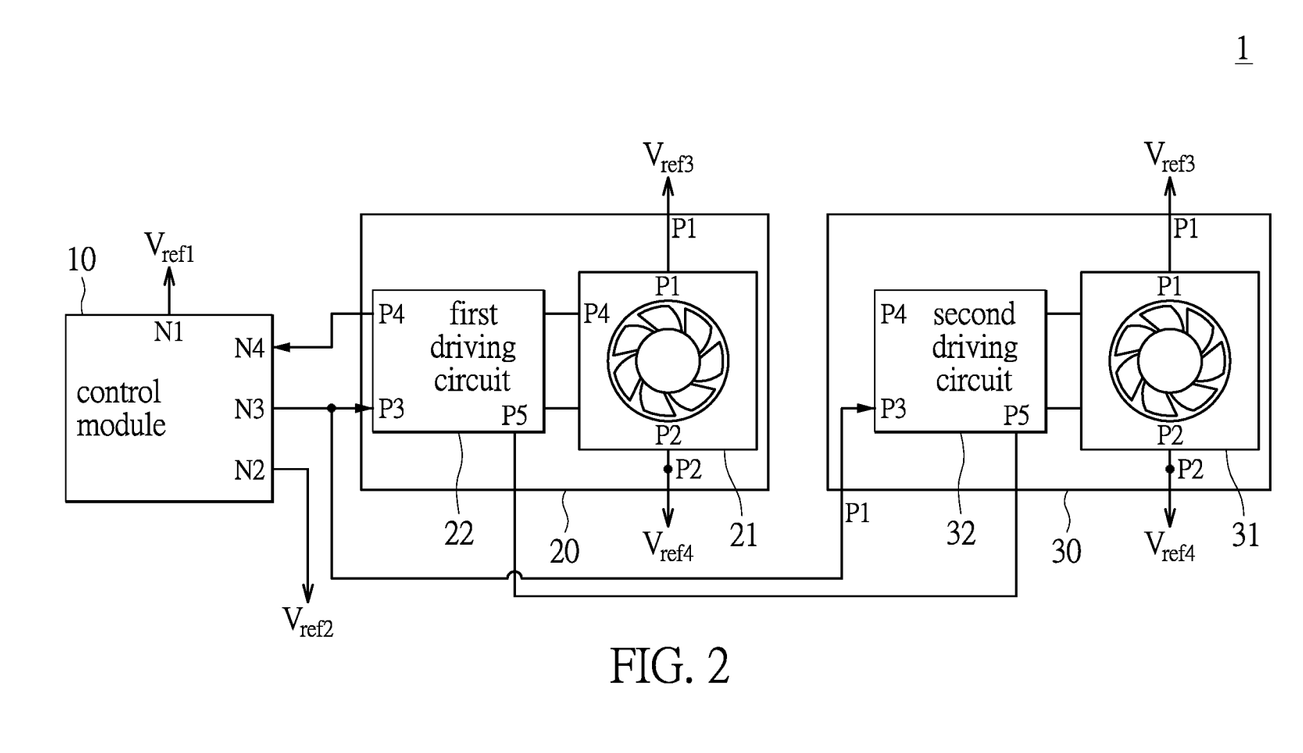
FIG. 2 shows a schematic diagram of a heat dissipation system of one embodiment of the present disclosure.
Figure 3:
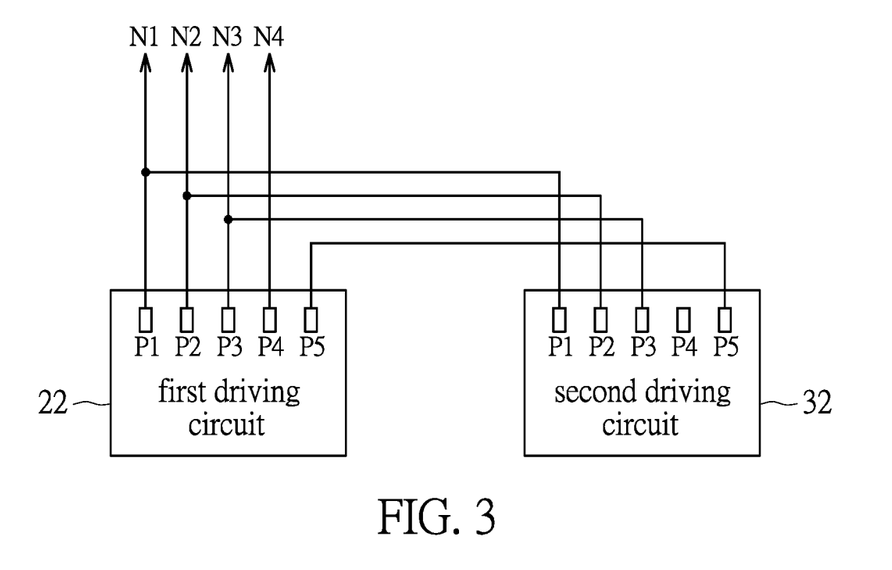
FIG. 3 shows a schematic diagram illustrating the pin connections of a heat dissipation system of one embodiment of the present disclosure.
Figure 4:
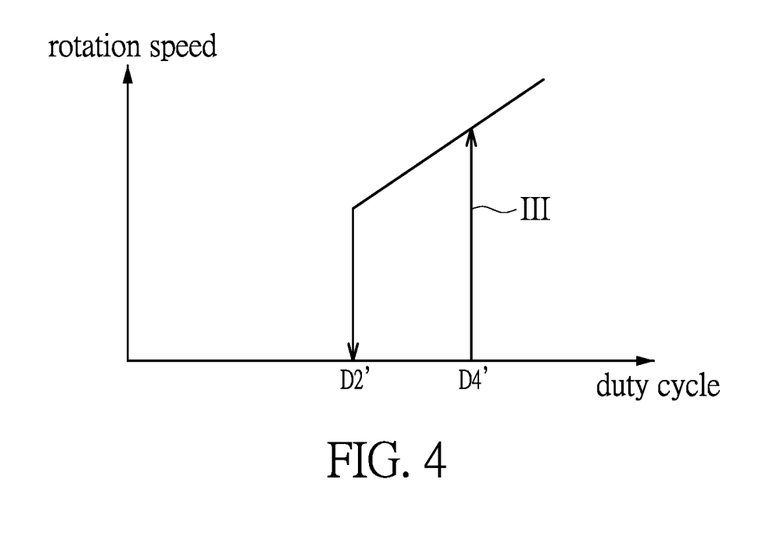
FIG. 4 shows a curve diagram illustrating the rotation speed of a heat dissipation system of one embodiment of the present disclosure.

Referring to FIGS. 2-4, which show a schematic diagram of a heat dissipation system of one embodiment of the present disclosure, a schematic diagram illustrating the pin connections of a heat dissipation system of one embodiment of the present disclosure, and a curve diagram illustrating the rotation speed of a heat dissipation system of one embodiment of the present disclosure.

The heat dissipation system 1 includes a control module 10, a first fan module 20 and a second fan module 30. For the ease of illustration, two fan modules are described in the following description for illustrating the present disclosure, but the number of fan modules is not restricted herein.

As shown in FIG. 1, the control module 10 has a first pin N1, a second pin N2, a third pin N3 and a fourth pin N4. The first pin N1 of the control module 10 receives a first reference voltage Vref1, and the second pin N2 of the control module 10 receives a second reference voltage Vref2. In this embodiment, the first reference voltage Vref1 is a direct voltage larger than 0V, and this direct voltage is provided to the control module 10 for working thereof. The value of the first reference voltage Vref1 can be adjusted and is not restricted herein. In this embodiment, the second reference voltage Vref2 is a grounding voltage, which is 0V; however, in other embodiments, the second reference voltage Vref2 may be adjusted and is not restricted herein. In this embodiment, the control module 10 can be configured to be separate from the first fan module 20 and the second fan module 30; however, where the control module 10, the first fan module 20 and the second fan module 30 are configured is not restricted herein.

The first fan module 20 includes a first fan 21 and a first driving circuit 22. Also, the first fan module 20 has a first pin P1, a second pin P2, a third pin P3, a fourth pin P4 and a fifth pin P5.

Similarly, the second fan module 30 includes a second fan 31 and a second driving circuit 32. The second fan module 30 has a first pin P1, a second pin P2, a third pin P3, a fourth pin P4 and a fifth pin P5.

As shown in FIG. 2, the first pin P1 of the first fan module 20 and the first pin P1 of the second fan module 30 receive a third reference voltage Vref3, and the second pin P2 of the first fan module 20 and the second pin P2 of the second fan module 30 receive a fourth reference voltage Vref4. The third pin P3 of the first fan module 20 and the third pin P3 of the second fan module 30 are electrically connected to the third pin N3 of the control module 10. The fourth pin P4 of the first fan module 20 is electrically connected to the fourth pin N4 of the control module 10. The fifth pin P5 of the first fan module 20 is electrically connected to the pin P5 of the second fan module 30. In this embodiment, the third reference voltage Vref3 is a direct voltage larger than 0V, and this direct voltage is provided to the first fan module 20 and the second fan module 30 for working thereof The value of the third reference voltage Vref3 can be adjusted and is not restricted herein. The fourth reference voltage Vref4 is a grounding voltage, which is 0V; however, in other embodiments, the fourth reference voltage Vref4 can be adjusted and is not restricted herein.

A control signal is transmitted from the third pin N3 of the control module 10 to the first driving circuit 22 of the first fan module 20 and to the second driving circuit 32 of the second fan module 30 to drive the first fan 21 and the second fan 31 respectively. In this embodiment, the control signal is a pulse width modulation signal, but it is not limited thereto. The fourth pin N4 of the control module 10 is configured for receiving a speed signal. Specifically, a speed signal is provided from the fourth pin P4 of the first fan module 20 to the fourth pin N4 of the control module 10, and the fourth P4 of the second fan module 30 receives no reference voltages and is not connected to other modules.

When the first fan module 20 works abnormally or is stopped working by the control module 10, a first trigger signal is provided from the fifth pin P5 of the first fan module 20 to the second fan module 30. As a result, the second fan module 30 also stops working. Specifically, the first driving circuit 22 outputs the first trigger signal from the fifth pin P5 of the first fan module 20 to the fifth pin P5 of the second fan module 30, to make the second driving circuit 32 of the second fan module 30 stop the rotation of the second fan 31 of the second fan module 30 when the first fan 21 of the first fan module 20 stops rotating. The first fan module 20 and the control module 10 form a looped control system, and the second fan module 30 works according to the first trigger signal transmitted from the fifth pin P5 of the first fan module 20. Likewise, when the control module 10 transmits a control signal to the first fan module 20 and the second fan module 30, a trigger signal is transmitted from the fifth pin P5 of the first fan module 20 to the fifth pin P5 of the second fan module 30. As a result, the second fan module 30 starts to rotate or stops rotating together with the first fan module 20 according to the trigger signal.

When the second fan module 30 works abnormally or stops rotating, a second trigger signal is transmitted from the fifth pin P5 of the second fan module 30 to the first fan module 20. As a result, the first fan module 20 also stops rotating. Thus, the first fan module 20 can transmit the first trigger signal to the second fan module 30, and the second fan module 30 30 can transmit the second trigger signal to the first fan module 20, such that the first fan module 20 and the second fan module 30 can start to rotate simultaneously or can stop rotating simultaneously.

As shown by the speed curve III in FIG. 4, the first fan module 20 and the second fan module 30 can start to rotate simultaneously or can stop rotating simultaneously according to the first trigger signal, so that when the first fan module 20 and the second fan module 30 rotate at a minimum speed, they can have the same duty cycle which is a second duty cycle D2 as shown in FIG. 4, and when the first fan module 20 and the second fan module 30 rotate at a maximum speed, they can have the same duty cycle which is a fourth duty cycle D4 as shown in FIG. 4.

Figure 5:
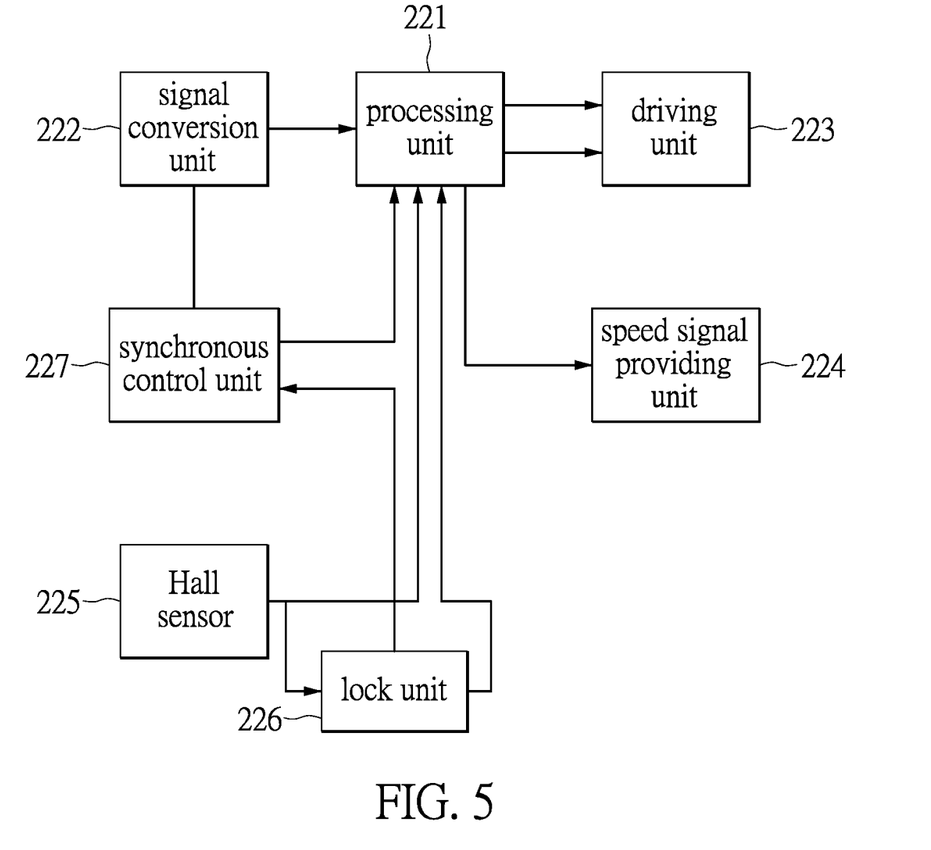
FIG. 5 shows a schematic diagram of a first driving circuit of one embodiment of the present disclosure.

Referring to FIG. 5, a schematic diagram of a first driving circuit of one embodiment of the present disclosure is shown.

It should be noted that, the first fan module 20 and the second fan module 30 have similar structures, and thus in the following description, details about the first driving circuit 22 are described but details about the second driving circuit 32 are omitted.

The first driving circuit 22 includes a processing unit 221, a signal conversion unit 222, a driving unit 223, a speed signal providing unit 224, a Hall sensor 225, a lock unit 226 and a synchronous control unit 227.

The signal conversion unit 222 is electrically connected to the processing unit 221 and the synchronous control unit 227. The signal conversion unit 222 is electrically connected to the third pin P3 of the first fan module 20. The signal conversion unit 222 receives a control signal from the control module 10 to process and convert the control signal to a processing signal. This processing signal is transmitted to the processing unit 221 or the synchronous control unit 227. When the processing signal is transmitted to the processing unit 221, the processing unit 221 transmits a plurality of control signals to the driving unit 223.

The driving unit 223 is electrically connected to the processing unit 221. The driving unit 223 transmits a plurality of driving signals to drive the first fan according to the control signals from the processing unit 221. In this embodiment, the driving unit 223 can be an H-bridge driving circuit, a bridge-type driving circuit or a three-phase bridge-type driving circuit. When the driving unit 223 is an H-bridge driving circuit, the H-bridge driving circuit can be composed of four MOSFETs or four BJTs. In this embodiment, the driving unit 223 is a driving circuit of a single-phase motor, but in other embodiments, the driving unit 223 can be a two-phase motor or a three-phase motor, and is not limited thereto.

The speed signal providing unit 224 is electrically connected to the processing unit 221. The speed signal providing unit 224 is electrically connected to the fourth pin P4 of the first fan module 20, so that the speed signal providing unit 224 can provide a signal through the fourth pin P4 of the first fan module 20. The speed signal providing unit 224 generates a speed signal corresponding to a fan phase variation that is detected by the Hall sensor 225. Then, the speed signal providing unit 224 transmits the speed signal corresponding to the fan phase variation to the control module 10 through the fourth pin P4 of the first fan module 20.

The Hall sensor 225 is electrically connected to the processing unit 221 and the lock unit 226. The lock unit 226 is electrically connected to the Hall sensor 225 and the processing unit 221. The Hall sensor 225 is configured to detect the phase variation of the first fan 21 to provide a Hall detection signal to the processing unit 221 and the lock unit 226. The lock unit 226 does not work when the Hall detection signal is normal. However, when the Hall detection signal indicates an abnormality (for example, when there is no phase variation), the lock unit 226 provides a lock signal to the processing unit 221 according to the abnormal Hall detection signal. When the processing unit 221 receives the lock signal, the processing unit 221 makes the driving unit 223 stop working, and proceeds to deal with an abnormal situation indicated by the Hall detection signal. Moreover, the lock unit 226 also transmits this lock signal to the synchronous control unit 227, such that the synchronous control unit 227 transmits a first trigger signal according to the lock signal to synchronous control units of other driving circuits to simultaneously make other driving circuit work or stop working.

The synchronous control unit 227 is electrically connected to the processing unit 221, the signal conversion unit 222 and lock unit 226. The synchronous control unit 227 is electrically connected to the fifth pin P5 of the first fan module 20. The signal conversion unit 222 provides a first adjustment signal to the synchronous control unit 227. Then, the synchronous control unit 227 provides a first synchronization signal to the processing unit 221, such that the processing unit 221 controls the first fan by the driving unit 223 according to the first synchronization signal. It should be noted that, the first synchronization signal corresponds to the first adjustment signal. At the same time, the synchronous control unit 227 provides a first trigger signal from the fifth pin P5 of the first fan module 20 to the fifth pin P5 of the second fan module 30.

Figure 6:
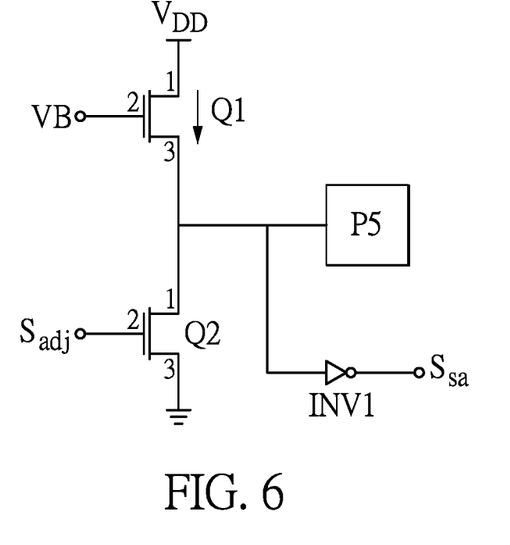
FIG. 6 shows a schematic diagram of a synchronous control unit of one embodiment of the present disclosure.

Referring to FIG. 6, a schematic diagram of a synchronous control unit of one embodiment of the present disclosure is shown.

For the ease of illustration, for the electronic elements having three or more pins, the pins of each element are labeled by different symbols that are used in describing the element. In addition, for the electronic elements having two pins, if this element is configured horizontally, the pin at the right side of element is defined as a first end and the pin at the left side of element is defined as a second end, and if this element is configured vertically, the pin at the top of element is defined as a first end and the pin at the bottom of element is defined as a second end.

The synchronous control unit 227 includes a first switch Q1, a second switch Q2 and an inverse unit INV1. The first end of the first switch Q1 receives a direct voltage VDD, and the second end of the first switch Q2 receives a bias voltage VB that is a stable voltage. The third end of the first switch Q1 is electrically connected to the first end of the second switch Q2. The second end of the second switch Q2 receives a first adjustment signal Sadj from the signal conversion unit 222. The third end of the first switch Q1 and the first end of the second switch Q2 are electrically connected to the fifth pin P5 of the first fan module 20. In addition, the third end of the first switch Q1 and the first end of the second switch Q2 are electrically connected to the second end of the inverse unit INV1. The first end of the inverse unit INV1 is electrically connected to the processing unit 221, so that a first synchronization signal Ssa can be provided to the processing unit 221. In this embodiment, the first end of the first switch Q1 receives a direct voltage VDD that is controlled by a bias voltage VB, and thus the first switch Q1 can be considered a direct current source.

When there is no first adjustment signal Sadj transmitted to the second end of the second switch Q2, the second switch Q2 does not work. That is, the second switch Q2 is turned off. However, since the first switch Q1 is controlled by the bias voltage VB, the first switch Q1 does work. Then, the fifth pin P5 of the first fan module 20 receives the direct voltage VDD, and thus the voltage at the fifth pin P5 of the first fan module 20 is a high level voltage and a high level signal is transmitted from the fifth pin P5 of the first fan module 20. When there is a first adjustment signal Sadj transmitted to the second switch Q2, the second switch Q2 works. That is, the second switch Q2 is turned on. The direct voltage VDD is divided by the first switch Q1 and the second switch Q2, so that the voltage at the fifth pin P5 of the first fan module 20 is a low level voltage and a low level signal is transmitted from the fifth pin P5 of the first fan module 20.

In this embodiment, different driving circuits are electrically connected by their fifth pins P5. With the first driving circuit 22 of the first fan module 20 and the second driving circuit 32 of the second fan module 30 as examples, the synchronous control unit 227 of the first driving circuit 22 transmits a high level signal or a low level signal, which is a first trigger signal, to the synchronous control unit of the second driving circuit 32. That is, this first trigger signal is transmitted from the fifth pin P5 of the first fan module 20 to the fifth pin P5 of the second fan module 30. As mentioned above, the first driving circuit 22 and the second driving circuit 32 have similar structures, and thus the synchronous control unit of the second driving circuit 32 and the synchronous control unit 227 have similar structures. When the synchronous control unit of the second driving circuit 32 receives a first trigger signal that is a low level signal, the voltage at the fifth pin of the second driving circuit 32 is pulled down to a low level voltage. Thus, through the inverse unit, the synchronous control unit of the second driving circuit 32 transmits a high level signal to the processing unit of the second driving circuit 32, so that the processing unit of the second driving circuit 32 works according to this high level signal. It should be noted that, the phase of this high level signal is opposite to the phase of the first trigger signal. At this time, the second switch of the synchronous control unit of the second driving circuit 32 does not work. That is, the second switch of the synchronous control unit of the second driving circuit 32 is turned off.

The phase of the first synchronization signal Ssa passing through the inverse unit INV1 is opposite to the high level signal or the low level signal transmitted from the fifth pin P5 of the first fan module 20. Specifically, when a high level signal is transmitted form the fifth pin P5 of the first fan module 20, the first synchronization signal Ssa received by the processing unit is a low level signal, but when a low level signal is transmitted form the fifth pin P5 of the first fan module 20, the first synchronization signal Ssa received by the processing unit is a high level signal. The processing unit 221 correspondingly provides a control signal to the driving circuit 223 to adjust the rotation of the fan according to the first synchronization signal Ssa.

In this embodiment, the first switch Q1 can be considered a pull-high resistor. Thus, a high level signal can be continually provided from the fifth pin P5 of the first fan module 20 without a control voltage. When the first switch Q1 is replaced with a pull-high resistor, one end of this pull-high resistor receives a direct voltage VDD and the other end of this pull-high resistor is electrically connected to the first end of the second switch Q2.

In another embodiment, the first switch Q1 and the second switch Q2 can respectively be controlled in a different way. Specifically, the second end of the first switch Q1 is electrically connected to the processing unit 222 to receive an adjustment signal from the processing unit 222 and the second end of the switch Q2 receives a constant voltage, such that the second switch Q2 is always turned on and a low level signal is continually outputted from the fifth pin P5 of the first fan module 20. When the adjustment signal provided by the processing unit 222 is a high level signal and thus the first switch Q1 is turned on, a high level signal is outputted from the fifth pin P5 of the first fan module 20. In this embodiment, the phase of the signal outputted from the fifth pin P5 of the first fan module 20 and the phase of the adjustment signal provided by the processing unit 222 is the same. In other embodiments, the voltage signals from the fifth pins P5 of the first fan module 20 and the second fan module 30 can be freely designed, and is not limited thereto. In addition, the second switch Q2 can be considered a direct current source that can make the fifth pin P5 of the first fan module 20 grounded. Moreover, the second end of the second switch Q2 receives a constant voltage, and the second switch Q2 can be replaced with a pull-down resistor. In this case, the first end of the first switch Q1 receives the direct voltage VDD, and the second end of the first switch Q1 is electrically connected to the processing unit 222 to receive an adjustment signal. Additionally, one end of the pull-down resistor is grounded, and the other end of the pull-down resistor is electrically connected to the third end of the first switch Q1.

[Another Embodiment of the Heat Dissipation System]

Figure 7:
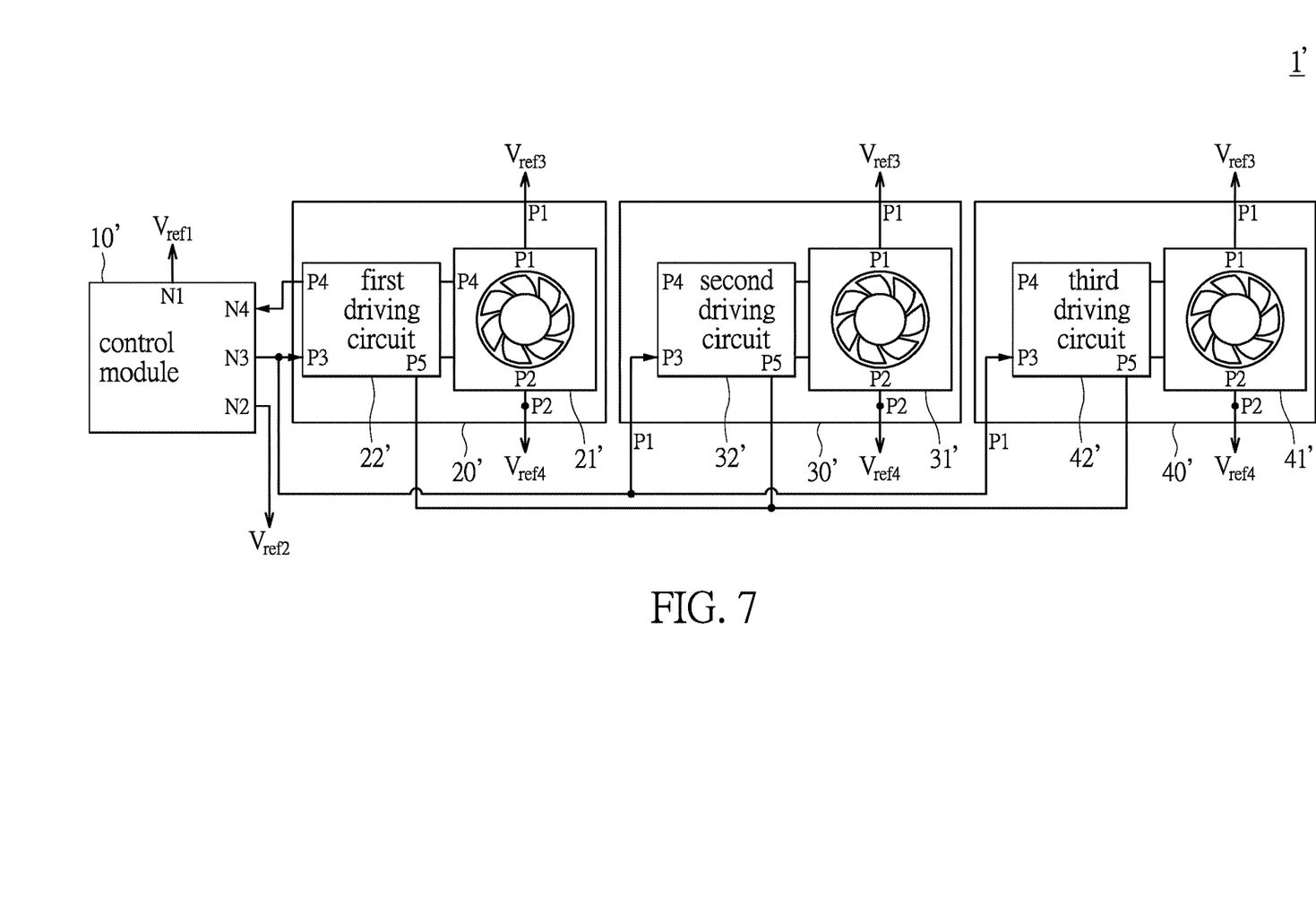
FIG. 7 shows a schematic diagram of a heat dissipation system of another embodiment of the present disclosure.

Referring to FIG. 7, a schematic diagram of a heat dissipation system of another embodiment of the present disclosure is shown.

The heat dissipation system 1' includes a control module 10', a first fan module 20', a second fan module 30' and a third fan module 40'. For the ease of illustration, three fan modules are described in the following description for illustrating the present disclosure, but the number of the fan modules is not restricted herein.

As shown in FIG. 7, the control module 10' includes a first pin N1, a second pin N2, a third pin N3 and a fourth pin N4. The first pin N1 of the control module 10' receives a first reference voltage Vref1, and the second pin N2 of the control module 10' receives a second reference voltage Vref2. In this embodiment, the first reference voltage Vref1 is a direct voltage larger than 0V, and this direct voltage is provided to the control module 10 for working thereof. The value of the first reference voltage Vref1 can be adjusted and is not restricted herein. The second reference voltage Vref2 is a grounding voltage, which is 0V; however, in other embodiments, the second reference voltage Vref2 can be adjusted and is not restricted herein.

The first fan module 20' includes a first fan 21' and a first driving circuit 22'. The first fan module 20' has a first pin P1, a second pin P2, a third pin P3, a fourth pin P4 and a fifth pin P5.

The second fan module 30', the third fan module 40' and the first fan module 20 have similar structures. The second fan module 30' includes a second fan 31' and a second driving circuit 32'. The second fan module 30' has a first pin P1, a second P2, a third pin P3, a fourth pin P4 and a fifth pin P5. The third fan module 40' includes a third fan 41' and a third driving circuit 32'. The third fan module 40' has a first pin P1, a second P2, a third pin P3, a fourth pin P4 and a fifth pin P5.

The first pin P1 of the first fan module 20' and the first pin P1 of the second fan module 30' receive a third reference voltage Vref3. The second pin P2 of the first fan module 20', the second pin P2 of the second fan module 30' and the second pin P2 of the third fan module 40' receive a fourth reference voltage Vref4. The third pin P3 of the first fan module 20', the third pin P3 of the second fan module 30' and the third fan module 40' are electrically connected to the third pin N3 of the control module 10'. The fourth pin p4 of the first fan module 20' is electrically connected to the third pin N3 of the control module 10'. The fifth pin P5 of the first fan module 20' is electrically connected to the fifth pin P5 of the second fan module 30' and the fifth pin P5 of the third fan module 40'. In this embodiment, the third reference voltage Vref3 is a direct voltage larger than 0V, and this direct voltage is provided to the first fan module 20', the second fan module 30' and the third fan module 40' for working thereof. The value of the third reference voltage Vref3 can be adjusted and is not restricted herein. The fourth reference voltage Vref4 is a grounding voltage, which is 0V; however, in other embodiments, the fourth reference voltage Vref4 can be adjusted and is not restricted herein.

A control signal is transmitted by the control module 10' from its third pin N3 to the first driving circuit 22' of the first fan module 20', the second driving circuit 32' of the second fan module 30' and the third driving circuit 42' of the third fan module 40', to respectively drive the first fan 21', the second fan 31' and the third fan 41'. In this embodiment, the control signal is a pulse width modulation signal, but is not limited thereto. A speed signal is transmitted from the fourth pin P4 of the first fan module 20' to the fourth pin N4 of the control module 10'. The fourth pin P4 of the second fan module 30' and the fourth pin P4 of the third fan module 40' are connected to no modules and receive no reference voltage.

When the first fan module 20' rotates abnormally or is controlled to stop rotating by the control module 10', a first trigger signal is transmitted from the fifth pin P5 of the first fan module 20' to the second fan module 30' and the third fan module 40', such that the second fan module 30' and the third fan module 40' also stop rotating. More specifically, the first driving circuit 22' of the first fan module 20' transmits a first trigger signal from the fifth pin P5 of the first fan module 20' to the fifth pin P5 of the second fan module 30' and to the fifth pin P5 of the third fan module 40', such that the second driving circuit 32' of the second fan module 30' and the third driving circuit 42' of the third fan module 40' make the second fan 31' and the third fan 41' stop rotating together with the first fan 21'. The first fan module 20' and the control module 10' form a looped control system, and the second fan module 30' and the third fan module 40' work according to a first trigger signal transmitted from the fifth pin P5 of the first fan module 20'. When the control module 10' transmits a control signal to the first fan module 20', the second fan module 30' and the third fan module 40', a first trigger signal is transmitted from the fifth pin P5 of the first fan module 20' to the fifth pin P5 of the second fan module 30' and to the fifth pin P5 of the third fan module 40', such that the first fan module 20', the second fan module 30' and the third fan module 40' can rotate or stop rotating simultaneously. Likewise, a second trigger signal can be transmitted from the fifth pin P5 of the second fan module 30' to the fifth pin P5 of the first fan module 20' to make the first fan module 20' rotate or stop rotating together with the second fan module 30', or a third trigger signal can be transmitted from the fifth pin P5 of third fan module 40' to the fifth pin P5 of the first fan module 20', to make the first fan module 20' rotate or stop rotating together with the third fan module 40'.

Moreover, when the second fan module 30' or the third fan module 40' rotates abnormally and thus stops rotating, the second fan module 30' transmits a second trigger signal from its fifth pin P5 to the first fan module 20', or the third fan module 40' transmits a third trigger signal from its fifth pin P5 to the first fan module 20', such that the first fan module 20' stops rotating together with the second fan module 30' or the third fan module 40'. In other words, the first fan module 20' can transmit a first trigger signal to the second fan module 30' and the third fan module 40' from its fifth pin P5, the second fan module 30' can transmit a second trigger signal to the first fan module 20' from its fifth pin P5, and the third fan module 40' can transmit a third trigger signal to the first fan module 20' from its fifth pin P5.

According to the first trigger signal, the second trigger signal or the third trigger signal, all of the first fan module 20', the second fan module 30' and the third fan module 40' can start to rotate or stop rotating simultaneously.

To sum up, in the heat dissipation system provided by the present disclosure, a trigger signal can be transmitted and received through the fifth pin of each fan module, such that all fan modules can start to rotate or stop rotating simultaneously. In the present disclosure, not every fan module is controlled by a feedback loop structure. However, by using a simpler structure, a plurality of fan modules in the heat dissipation system provided by the present disclosure can start to rotate or stop rotating simultaneously. Thus, the financial cost and the time consumption in the design of the heat dissipation system can be decreased, and the yield rate of the heat dissipation system can be increased. In addition, the stability of the heat dissipation system can be effectively improved.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A heat dissipation system, receiving a control signal from a control module, wherein the control module has a first pin receiving a first reference voltage and a second pin receiving a second reference voltage, comprising:
    a first fan module, including:
        a first pin;
        a second pin;
        a third pin;
        a fourth pin; and
        a fifth pin, wherein the first pin of the first fan module receives a third reference voltage, the second pin of the first fan module receives a fourth reference voltage, the third pin of the first fan module is electrically connected to a third pin of the control module, and the fourth pin of the first fan module is electrically connected to a fourth pin of the control module; and
    a second fan module, including:
        a first pin;
        a second pin;
        a third pin;
        a fourth pin; and
        a fifth pin, wherein the first pin of the second fan module receives the third reference voltage, the second pin of the second fan module receives the fourth reference voltage, the third pin of the second fan module is electrically connected to the third pin of the control module, and the fifth pin of the second fan module is electrically connected to the fifth pin of the first fan module;
    wherein the control signal is provided from the third pin of the control module to the first fan module and the second fan module;
    wherein a speed signal is provided from the third pin of the first fan module to the control module;
    wherein a first trigger signal is transmitted from the fifth pin of the first fan module to the second fan module, and the second fan module starts to rotate or stops rotating together with the first fan module according to the first trigger signal.

2. The heat dissipation system according to claim 1, wherein a second trigger signal is transmitted from the fifth pin of the second fan module to the first fan module, and the first fan module starts to rotate or stops rotating together with the second fan module according to the second trigger signal.

3. The heat dissipation system according to claim 1, wherein when the first fan module stops rotating or starts to rotate, the first trigger signal is provided from the fifth pin of the first fan module to the second fan module, such that the second fan module stops rotating or starts to rotate together with the first fan module.

4. The heat dissipation system according to claim 1, wherein the first reference voltage and the third reference voltage are a non-zero direct voltage, and the second reference voltage and the fourth reference voltage are a grounding voltage.

5. The heat dissipation system according to claim 1, wherein the first fan module includes:
    a first fan; and
    a first driving circuit, providing a driving signal to drive the first fan, and including:
        a processing unit;
        a signal conversion unit, receiving and converting a control signal to a processing signal, wherein the control signal is a pulse width modulation signal;
        a driving unit, electrically connected to the processing unit, providing the driving signal to drive the first fan according to at least one control signal from the processing unit, wherein the driving signal corresponds to the control signal; and
        a synchronous control unit, electrically connected to the processing unit, providing a first synchronization signal to the processing unit according to a first adjustment signal from the signal conversion unit;
    wherein the first trigger signal is provided from the fifth pin of the synchronous control unit to the second fan module, such that the second fan module starts to rotate or stops rotating together with the first fan module according to the first trigger signal.

6. The heat dissipation system according to claim 5, wherein the synchronous control unit includes:
    a direct current source; and
    a switch, having a first end electrically connected to the direct current source, having a second end electrically connected to the processing unit, and having a third end being grounded.

7. The heat dissipation system according to claim 6, wherein the direct current source includes:
   a first switch, having a first end receiving a direct voltage, having a second end receiving a bias voltage, and having a third end electrically connected to the first end of the switch, wherein the synchronous control unit outputs the first trigger signal by electrically connecting the third end of the first switch and the fifth pin of the first driving circuit.

8. The heat dissipation system according to claim 5, wherein the synchronous control unit includes:
   a pull-high resistor, having one end receiving a direct voltage; and
   a switch, having a first end electrically connected to the pull-high resistor, having a second end electrically connected to the processing unit, and having a third end being grounded.

9. The heat dissipation system according to claim 5, wherein the synchronous control unit includes:
   a direct current source, having one end being grounded; and
   a switch, having a first end receiving a direct voltage, having a second end electrically connected to the processing unit, and having a third end electrically connected to the direct current source.

10. The heat dissipation system according to claim 5, wherein the synchronous control unit includes:
    a pull-down resistor, having one end being grounded; and
    a switch, having a first end receiving a direct voltage, having a second end electrically connected to the processing unit, and having a third end electrically connected to the pull-down resistor.

11. The heat dissipation system according to claim 5, wherein the first driving circuit further includes:
    a Hall sensor, providing a Hall detection signal; and
    a speed signal providing unit, providing a speed signal according to the Hall detection signal.

12. The heat dissipation system according to claim 11, wherein the first driving circuit includes:
    a lock unit, providing a lock signal to the processing unit when the Hall detection signal indicates an abnormality.

13. The heat dissipation system according to claim 12, wherein the processing unit adjusts the first fan according to the lock signal and the first adjustment signal.

14. The heat dissipation system according to claim 5, wherein the driving unit is an H-bridge driving circuit, a bridge-type driving circuit or a three-phase bridge-type driving circuit.

* * * * *